United States Patent
Woods et al.

(12) 
(10) Patent No.: US 6,252,291 B1
(45) Date of Patent: Jun. 26, 2001

(54) MODIFIABLE SEMICONDUCTOR CIRCUIT ELEMENT

(75) Inventors: Paul R. Woods, Corvallis; Ignacio J. Perez, Salem, both of OR (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/162,629

(22) Filed: Sep. 28, 1998

(51) Int. Cl.$^7$ .................................................. H01L 29/00
(52) U.S. Cl. ............................................ 257/529; 257/530
(58) Field of Search .................................... 257/529, 530, 257/758, 760; 438/281, 601, 637, 675

(56) References Cited

U.S. PATENT DOCUMENTS

| | | | |
|---|---|---|---|
| 5,360,988 | 11/1994 | Uda et al. ............................... | 257/529 |
| 5,659,201 | * 8/1997 | Wollesen ............................... | 257/758 |
| 5,675,174 | * 10/1997 | Nakajima et al. ..................... | 257/529 |
| 5,734,187 | * 3/1998 | Bohr et al. ............................. | 257/758 |
| 5,764,563 | * 6/1998 | Sur, Jr. et al. ......................... | 257/530 |
| 5,900,668 | * 5/1999 | Wollesen ............................... | 257/522 |
| 6,040,615 | * 3/2000 | Nagai et al. ........................... | 257/529 |

FOREIGN PATENT DOCUMENTS

| | | | |
|---|---|---|---|
| 0020116 | 5/1980 | (EP) | ............................... H01L/27/02 |
| 0408060 | 7/1990 | (EP) | ............................... H01L/23/525 |
| 0681329 | 9/1994 | (EP) | ............................... H01L/23/538 |
| 8-213465 | * 8/1996 | (JP) . | |

* cited by examiner

Primary Examiner—Olik Chaudhuri
Assistant Examiner—Phat X. Cao

(57) ABSTRACT

An integrated circuit chip having a substrate with several overlaying metal layers. A lower metal layer is adjacent the substrate and an upper layer is spaced above the lower layer. The chip has circuitry including a number of circuit elements, and a number of access elements, each associated with and electrically connected to one of the circuit elements. Each access element includes first and second terminals in the lower layer, and an elongated span element in the upper layer. The span element has a first end overlaying and electrically connected to the first terminal and a second end overlaying and electrically connected to the second terminal. One of the terminals may be connected to provide power or a connection to the input or output of the associated circuit element. The chip may then be modified by severing the span element, or by connecting the span element to other circuitry on the chip to disable or enable operation of the circuit element.

19 Claims, 3 Drawing Sheets

MODIFIABLE SEMICONDUCTOR CIRCUIT ELEMENT

FIELD OF THE INVENTION

This invention relates to semiconductor circuits, and more particularly to circuits having multiple conductor layers.

BACKGROUND AND SUMMARY OF THE INVENTION

In the design and development of semiconductor integrated circuit chips, it is often necessary to generate several iterations until an ideal design is reached. At each iteration, performance characteristics are measured and analyzed, and adjustments made to tune performance as needed. In addition, design requirements may change, requiring further changes. These issues are particularly significant for Application-Specific Integrated Circuit (ASIC) chips, which must be designed from standard elements for each new product or application.

To avoid the substantial cost and time delay to regenerate the multiple masks needed for the multiple layers of a chip upon each iteration, ASIC chip are typically provided with extra cells, or blocks of gates or other standard functional circuit elements. These cells may include complex blocks or may be simple electronic elements. When design revision is needed for a new iteration, experimental changes may be made to the existing chip by operationally connecting or disconnecting a spare cell as needed to the existing main circuitry. This enables design revision options to be tested promptly and without the substantial cost of a new mask work set. The changes may be made by focused ion beam (FIB) technology, which may be used to sever existing metal traces, or to deposit a conductive "jumper" to connect existing traces. This may be used to supply power to a spare cell, and/or to connect the input or output of such a cell to the primary circuitry, thus inserting it in the circuit.

In addition, the use of spare cells of circuit elements is also useful for implementing experimental changes proven by FIB modification in a prototype, because the needed circuit element already exists on the multiple mask layers, and it is generally necessary to change only one metal mask layer to connect the cell into the primary circuitry. Thus, the modified circuit may be manufactured without changing most existing masks, and without using the FIB techniques that are impractical for efficient and reliable manufacturing.

While the use of spare cells of circuit elements and FIB modification is effective for development of some existing integrated circuits, it is often unsuitable for the increasingly fine and dense metal patterns on many newer chips, particularly those with increasing numbers of metal layers. This is because a metal trace that one might desire to access is inaccessible beneath other metal layers. Whether one needs to sever the trace or to connect a jumper trace, it may be impractical to do so without damaging overlaying circuitry that must remain undisturbed.

The present invention overcomes the limitations of the prior art by providing an integrated circuit chip having a substrate with several overlaying metal layers. A lower metal layer is adjacent the substrate and an upper layer is spaced above the lower layer. The chip has circuitry including a number of circuit elements, and a number of access elements, each associated with and electrically connected to one of the circuit elements. Each access element includes first and second terminals in the lower layer, and an elongated span element in the upper layer. The span element has a first end overlaying and electrically connected to the first terminal and a second end overlaying and electrically connected to the second terminal. One of the terminals may be connected to provide power or a connection to the input or output of the associated circuit element. The chip may then be modified by severing the span element, or by connecting the span element to other circuitry on the chip to disable or enable operation of the circuit element.

DETAILED DESCRIPTION OF A PREFERRED EMBODIMENT

Figure 1:
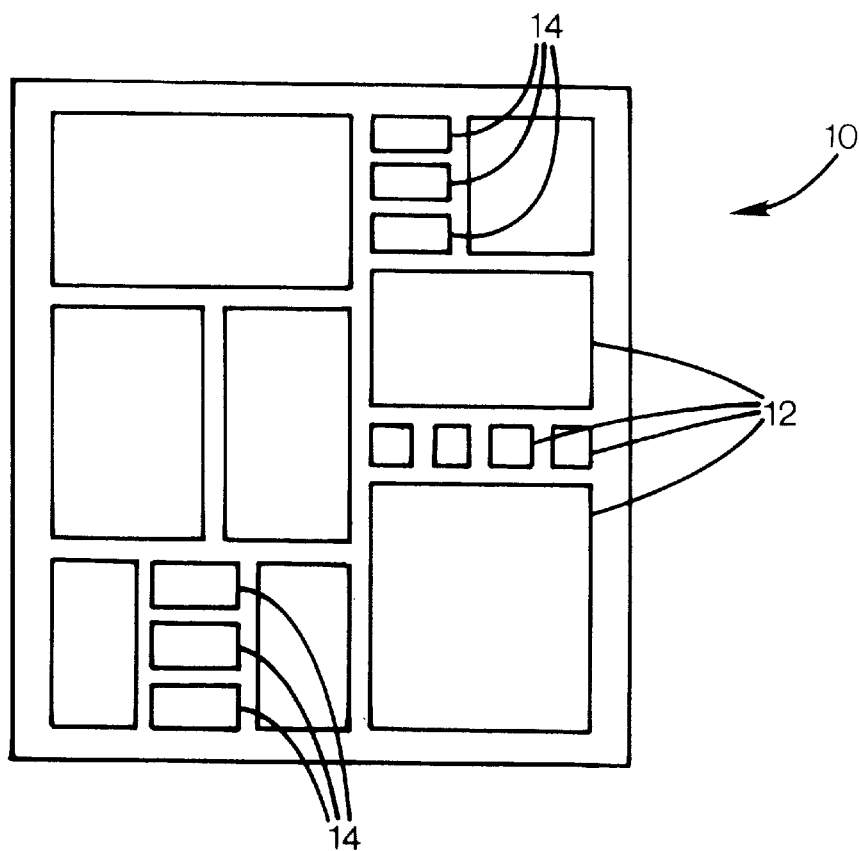
FIG. 1 is a simplified plan view of an integrated circuit chip according to a preferred embodiment of the invention.

FIG. 1 shows an application specific integrated circuit (ASIC) chip 10 having a plurality of interconnected circuit elements or cells 12, each of which typically has a standardized function, and which are arranged to provide a customized chip function. Although a limited number of large cells are illustrated for clarity, actual chips typically contain hundreds of thousands of cells, with ongoing increases being anticipated. The chip circuitry includes several spare circuit elements or extra cells 14. These are selected to have functions that may be desired in the event of a chip design refinement, such as often occurs during development and prototyping. Some of the spare cells are typically disconnected from the primary circuitry elements 12, and others may be electrically connected, and optionally disconnected for testing design changes.

Figure 2:
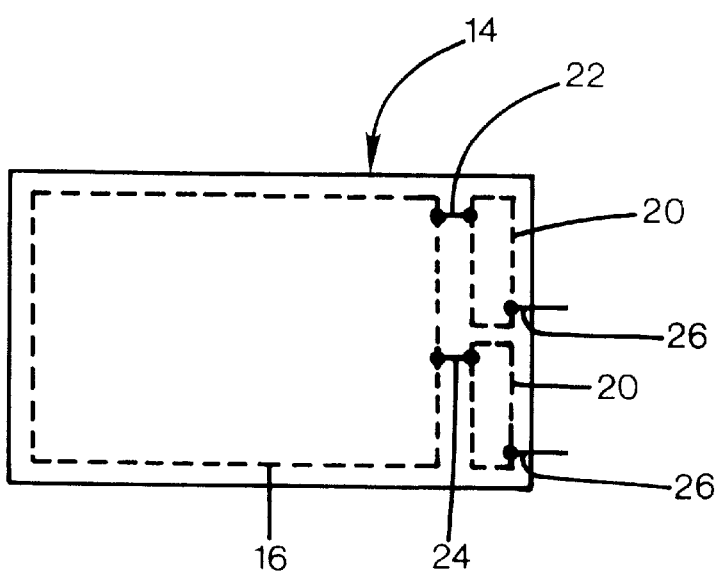
FIG. 2 is an enlarged view of a circuit element according to the embodiment of FIG. 1.

As shown in FIG. 2, each spare cell 14 includes a functional circuit block 16, and one or more access elements 20, with two being preferred in the illustrated case. In a typical instance, the circuit block 16 is a logic circuit including a set of interconnected gates, and having a logic input line 22, and an output line 24. The input and output lines are connected to respective access elements, as will be discussed below. The access elements 20 have respective external connection lines 26 that extend from the cell 14, and which may connect to other circuitry if desired. In alternative embodiments, the circuit block may include any circuitry or component that is used on an integrated circuit, with one or more access elements providing a connection to any electrical node on the included circuitry. The circuitry need not be digital logic circuitry, but may include any electronic component or components including active analog elements, or passive components. The access elements need not be connected to input or output lines, but may additionally or alternatively be connected to any of power, ground, clock, control, signal or other lines that a circuit element might employ, and which would be useful for enabling, disabling, or modifying circuit function.

The illustrated cell 14 is a spare cell that is typically disconnected from other circuitry, so that the connections 26 terminate at the access elements. However, the same arrangement is also employed for circuit elements included in the primary circuitry of a chip, that is, the circuitry that is operationally connected upon initial manufacturing. In this case, the connections 26 are connected to other circuit elements to provide integration of the circuit. When the access elements are thus used in a primary (non-spare) cell, the access element is the sole path providing electrical connection to the associated line.

Figure 3:
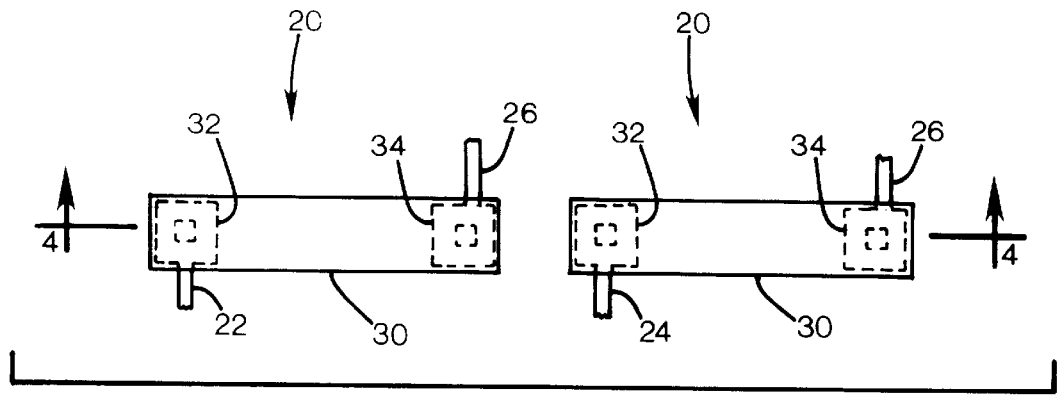
FIG. 3 is an enlarged view of a pair of access elements according to the embodiment of FIG. 1.

FIG. 3 shows a detailed view of the access elements 20. Each element has an elongated conductive span element 30 that provides electrical connection between spaced apart first and second terminals 32, 34. The lines 22, 24 from the circuit element 16 are connected to the respective first terminals, and the connections 26 optionally connect to other circuit blocks.

Figure 4:
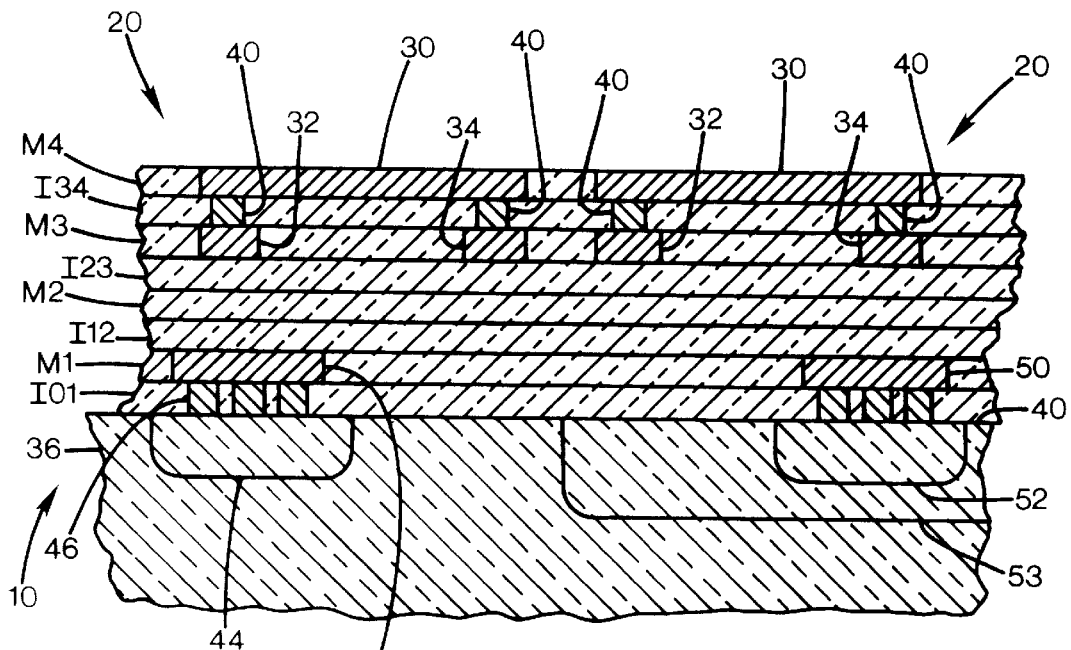
FIG. 4 is an sectional view of an access element taken along line 4—4 of FIG. 3.

FIG. 4 shows a sectional view of the structure of the access elements 20. The chip 10 has a silicon substrate 36 with a plurality of overlaying alternating insulating and metal layers. Beginning at the upper surface 40 of the substrate the layers are: insulating layer I01, metal layer M1, insulating layer I12, metal layer M2, insulating layer I23, metal layer M3, insulating layer I34, metal layer M4, with M4 being the uppermost layer most remote from the substrate. As shown, the metal layers are not entirely metal, but may have limited patterned regions of metal, with the adjacent portions of the layer filled with an insulating material to provide flat, parallel layers. Similarly, the insulating layers are not entirely insulating, but may include conductive plugs or vias that provide an electrical connection between adjacent metal layers.

As illustrated, the span elements 30 are formed in the upper metal layer M4, and the terminals 32, 34 of each access element 20 are formed in the immediately lower metal layer M3, below the respective ends of each span. In practical terms, the ends of the upper span may function equally well as terminals, as a connection to other circuitry of by a later-added conductor trace may be made to the upper layer. An associated conductive via provides connection between the span ends and the terminals. Metal layer M2 is unused in the standard access element illustrated. In metal layer M1, a ground line 42 overlays a p-island 44 in the substrate and is connected by vias 46 in insulating layer I01. A Vdd line 50 overlays an n-island 52 and a surrounding n-well 53 in the substrate and is similarly connected by vias 54 in insulating layer I01. The Vdd and Ground lines extend perpendicularly to the illustration, and are simple shunts employed in all standard cells to provide communication to linearly adjacent cells. These are not essential to the access elements 20 in the upper layers.

In alternative embodiments not using the preferred means of transmitting power and ground between adjacent cells, the lower layers and substrate may be provided with any alternative functional circuitry to efficiently use the space in a manner unrelated to the function of the access element. For instance, the lower layers may include circuitry of the associated circuit element 16, so that the access element essentially partially overlays the associated circuit element to conserve chip area. The Ground and Vdd lines 42, 50 may be considered as extending functional portions of the adjacent circuit element. Typically, the upper metal layers M3 and M4 are used for connections between cells, and the lower metal layers M1 and M2 are used for connections within cells.

Figure 5:
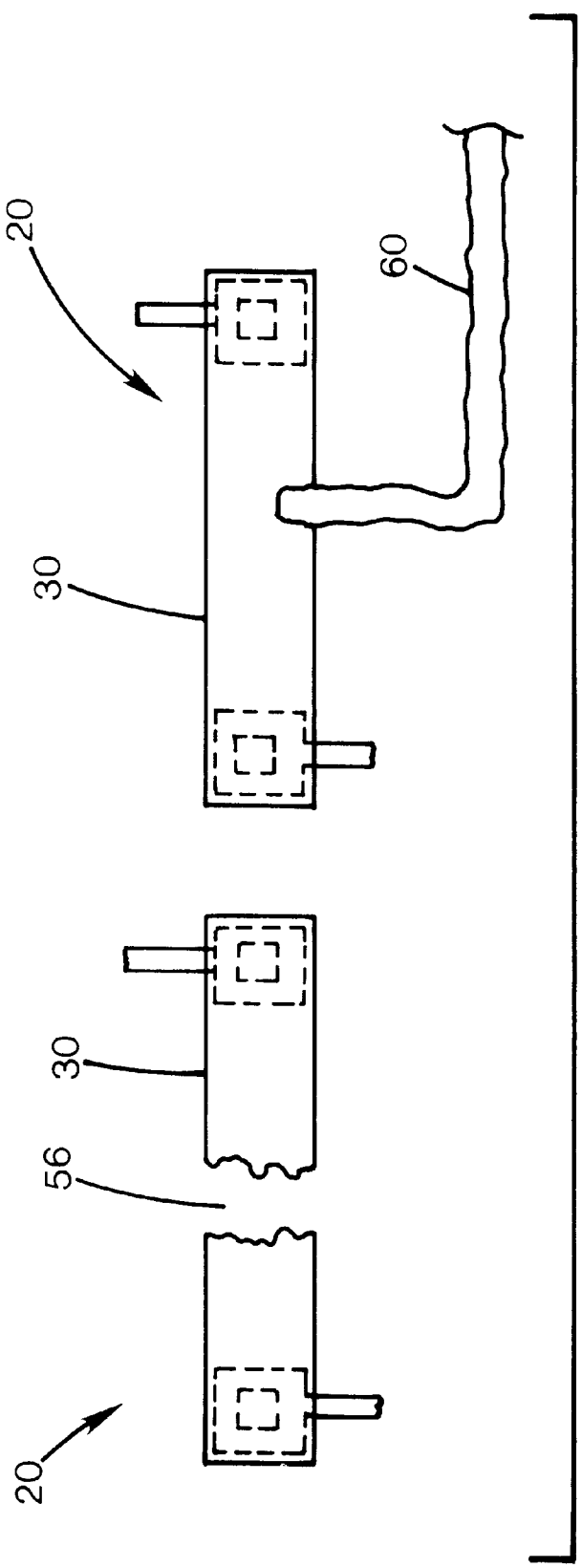
FIG. 5 is an enlarged view of a pair of access elements according to the embodiment of FIG. 1 in modified conditions.

As shown in FIG. 5, the access elements 20 may be modified by Focused Ion Beam (FIB) methods or by other methods. In the illustration, one span has been severed by a FIB to provide a gap 56 preventing current flow between the terminals. The other span is intact, and a conductive trace 60 has been deposited by a FIB, extending from the span 30 to circuitry elsewhere on the chip. In typical implementations, both are likely to receive the same treatment, either both severed, or both connected to respective circuitry. Spare unused cells are connected by the trace deposition, and primary cells are disabled by severing. In some implementations, a single span may be severed and one or both sides connected by a deposited trace, so that the circuit element is disconnected from one circuit portion, and reconnected to another.

The development process proceeds iteratively. An initial design is established and implemented, including spare cells as dictated by probable design modifications. The initial design is produced, tested, and analyzed. Modifications are proposed, and implemented by connecting and/or disconnecting the access elements of appropriate circuit cells using FIB or similar techniques. The modified chip is tested and evaluated, and further FIB modifications may be made. When no further modifications are required, the changes may be implemented by revising only the uppermost metal layer, with the desired access elements being "severed" in the artwork, and desired extra traces being included in the artwork of the upper layer. Thus, the unused extra cells remain on the chip, and artwork costs are minimized. This is particularly for smaller production runs of custom chips. For large volumes, for which mask costs are effectively amortized to have a minimal effect on production costs, all artwork layers may be revised to minimize chip size by eliminating extra unused cells.

In the preferred embodiment, the terminals are 1.0 microns ($10^{-6}$ m) wide, the span elements are 1.2 microns wide and 6.0 microns long. While the above is discussed in terms of preferred and alternative embodiments, the invention is not intended to be so limited. For instance, the number of metal layers may be varied widely. The span element must remain on the uppermost layer used in the cell, so that other metal patterns to not overlay the span. However, this may be implemented in designs with as few as 2 metal layers. In other embodiments, metal layers may be layered above the layer containing the span, as long as no metal pattern overlay the span in the region of the access element.

What is claimed is:

1. An integrated circuit chip comprising:
   a substrate;
   a plurality of metal layers overlaying the substrate;
   the metal layers including a lower layer adjacent the substrate and an upper layer spaced above the lower layer;
   circuitry including a plurality of circuit elements on the substrate;
   a plurality of access elements, each associated with and electrically connected to a selected one of the circuit elements;
   each access element including a terminal in the lower layer, an elongated span element in the upper layer having a first end overlaying and electrically connected to the terminal and a second end overlaying providing a second terminal; and
   wherein each circuit element is functionally isolated from the circuitry except for each access element providing the sole connection of a logic line to the circuitry.

2. The chip of claim 1 wherein, for at least one of the circuit elements, one of the terminals is connected to the circuit element, such that severing the span element disconnects the circuit element from the other terminal and any connected circuitry.

3. The chip of claim 1 wherein the circuit element has an input node and an output node, and wherein the access element is connected to at least one of the input and output nodes, such that severing the span element functionally disconnects the circuit element.

4. The chip of claim 1 wherein the circuit element has a plurality of interface nodes which all must be connected to other portions of the circuitry for operation of the circuit element, and wherein at least one of the nodes is electrically isolated from the other portions of the circuitry and connected to one terminal of the access element.

5. The chip of claim 4 including an electrical connection between the span and the circuitry applied above the upper layer.

6. The chip of claim 1 wherein the chip includes an additional metal layer below the lower layer and more closely adjacent the substrate.

7. The chip of claim 1 including an insulative layer between the upper and lower metal layers, and wherein the insulative layer defines vias at the ends of the span.

8. The chip of claim 1 wherein all logic lines to each circuit element pass solely via respective access elements.

9. The chip of claim 1 wherein the logic line is selected from a group comprising inputs, outputs, clock lines, and signal lines.

10. An integrated circuit access element for an integrated circuit chip having a substrate supporting circuitry including upper and lower metal layers and including a plurality of circuit elements, the access element comprising:

first and second terminals formed in the lower metal layer;

an elongated span element in the upper metal layer electrically connecting the terminals together;

the span element having a first end overlaying and electrically connected to the first terminal;

the span element having a second end overlaying and electrically connected to the second terminal; and each circuit element being isolated from the circuitry except via the span element, wherein the first terminal is connected to a selected line of the circuit element, and the second terminal is connected to the circuitry, such that the span element is the sole connection of the circuitry to the selected line of the circuit element.

11. The element of claim 10 wherein one of the terminals is connected to the circuit element, such that severing the span element disconnects the circuit element from the other terminal and any connected circuitry.

12. The element of claim 10 wherein one of the terminals is connected to an associated circuit element having an input node and an output node, and wherein the terminal is connected to at least one of the input and output nodes, such that severing the span element functionally disconnects the circuit element.

13. The element of claim 10 wherein an associated circuit element has a plurality of interface nodes which all must be connected to other portions of the circuitry for operation of the circuit element, and wherein at least one of the nodes is electrically isolated from the other portions of the circuitry and connected to one terminal of the access element.

14. The element of claim 13 including an electrical connection between the span and the circuitry applied above the upper layer.

15. The element of claim 10 wherein the chip includes an additional metal layer below the lower layer and more closely adjacent the substrate.

16. The element of claim 10 including an insulative layer between the upper and lower metal layers, and wherein the insulative layer defines vias at the ends of the span.

17. The element of claim 10 wherein the selected line is a logic line.

18. The element of claim 10 wherein the selected line is selected from a group of lines comprising inputs, outputs, clock lines, and signal lines.

19. The element of claim 10 wherein all logic lines to the circuit element pass through respective span elements.

* * * * *